United States Patent
Song et al.

(10) Patent No.: US 8,525,349 B2
(45) Date of Patent: Sep. 3, 2013

(54) SEMICONDUCTOR DEVICE PACKAGES STACKED TOGETHER HAVING A REDISTRIBUTION LAYER

(75) Inventors: In-Sang Song, Seoul (KR); Kyung-Man Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 42 days.

(21) Appl. No.: 13/217,383

(22) Filed: Aug. 25, 2011

(65) Prior Publication Data

US 2012/0080806 A1    Apr. 5, 2012

(30) Foreign Application Priority Data

Oct. 5, 2010    (KR) ........................ 10-2010-0096705

(51) Int. Cl.
*H01L 29/40* (2006.01)
*H01L 23/02* (2006.01)
*H01L 23/34* (2006.01)
*H01L 21/00* (2006.01)

(52) U.S. Cl.
USPC ............ 257/777; 257/686; 257/723; 438/109

(58) Field of Classification Search
USPC ................................................ 257/686, 777
See application file for complete search history.

(56) References Cited

U.S. PATENT DOCUMENTS

| 5,723,906 | A  | * | 3/1998  | Rush .............................. 257/723 |
| 6,369,448 | B1 | * | 4/2002  | McCormick .................... 257/777 |
| 6,472,747 | B2 | * | 10/2002 | Bazarjani et al. ............. 257/724 |
| 2004/0262734 | A1 | * | 12/2004 | Yoo .................................. 257/686 |
| 2009/0011541 | A1 | * | 1/2009  | Corisis et al. ................. 438/109 |
| 2009/0166835 | A1 | * | 7/2009  | Yang et al. ..................... 257/686 |
| 2009/0236735 | A1 | * | 9/2009  | Corisis et al. ................. 257/723 |
| 2009/0309206 | A1 |   | 12/2009 | Kim et al. |

FOREIGN PATENT DOCUMENTS

| KR | 100842915 | 6/2008 |
| KR | 100886717 | 2/2009 |

* cited by examiner

*Primary Examiner* — Long K Tran
*Assistant Examiner* — Dzung Tran
(74) *Attorney, Agent, or Firm* — F. Chau & Associates, LLC

(57) ABSTRACT

A semiconductor package includes a first package including a first substrate and at least one first semiconductor chip mounted on the first substrate, a redistribution wiring layer provided on the first package and including a connection pad, a bonding pad electrically connected to the connection pad and a dummy bonding pad electrically connected to the bonding pad, a second package stacked on the first package via the redistribution wiring layer and electrically connected to the connection pad of the redistribution wiring layer by a first connection member, a bonding wire electrically connecting the bonding pad to the first substrate, and a dummy bonding wire electrically connecting the dummy bonding pad to the first substrate.

18 Claims, 15 Drawing Sheets

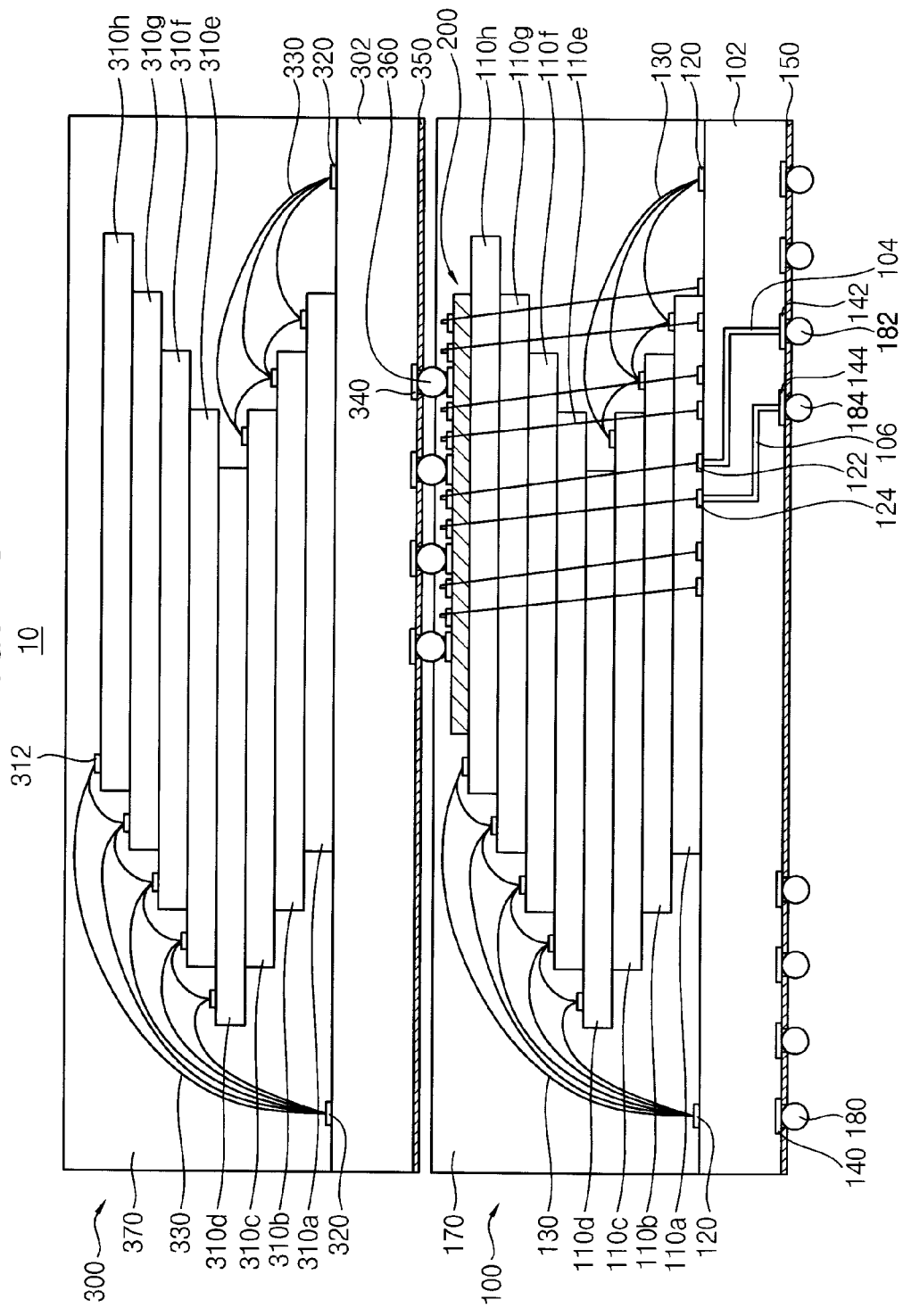

SEMICONDUCTOR DEVICE PACKAGES STACKED TOGETHER HAVING A REDISTRIBUTION LAYER

CROSS-REFERENCE TO RELATED APPLICATION

This application claims priority under 35 U.S.C. §119 to Korean Patent Application No. 2010-96705, filed on Oct. 5, 2010 in the Korean Intellectual Property Office (KIPO), the entire contents of which are herein incorporated by reference.

BACKGROUND

1. Field

Example embodiments relate to a semiconductor package and a method of manufacturing the semiconductor package. More particularly, example embodiments relate to a semiconductor package including packages stacked using a redistribution wiring layer and a method of manufacturing the semiconductor package.

2. Discussion of the Related Art

Package-on-package (POP) technology for stacking a plurality of packages has been used for high-density chip stacking. Since semiconductor packages for use in POP technology may be determined to be acceptable through tests, a defect rate may drop in end products.

The POP type of semiconductor package may include a first package and a second package stacked on the first package using a redistribution wiring layer. In a method of manufacturing a conventional semiconductor package of POP type, a test process is performed after the second package is stacked on the first package. Accordingly, a failure of a redistribution wire bonding process may result in a defect in an end product, thereby decreasing yields of products.

SUMMARY

Example embodiments provide a semiconductor package having a redistribution wiring structure capable of increasing product yield.

Example embodiments provide methods of manufacturing the semiconductor package.

According to example embodiments, a semiconductor package includes a first package including a first substrate and at least one first semiconductor chip mounted on the first substrate, a redistribution wiring layer provided on the first package and including a connection pad, a bonding pad electrically connected to the connection pad and a dummy bonding pad electrically connected to the bonding pad, a second package stacked on the first package via the redistribution wiring layer and electrically connected to the connection pad of the redistribution wiring layer through a first connection member, a bonding wire electrically connecting the bonding pad to the first substrate, and a dummy bonding wire electrically connecting the dummy bonding pad to the first substrate.

In example embodiments, the redistribution wiring layer may include a conductive line that electrically connects the bonding pad and the dummy bonding pad.

In example embodiments, the redistribution wiring layer may include a first conductive line that electrically connects the connection pad and the bonding pad and a second conductive line that electrically connects the connection pad and the dummy bonding pad.

In example embodiments, the first substrate may include a substrate pad that is connected to the bonding wire and a dummy substrate pad that is connected to the dummy bonding wire.

In example embodiments, the semiconductor package may further include a second connection member and a dummy connection member provided on a lower surface of the first substrate. The second connection member is electrically connected to the substrate pad and the dummy connection member is electrically connected to the dummy substrate pad. An electrical signal may be inputted/outputted to/from the second package through the second connection member.

In example embodiments, the first package may include a plurality of first semiconductor chips stacked on each other, and the redistribution wiring layer may be provided on the uppermost first semiconductor chip of the first package.

In example embodiments, the first package may include a first mold member that covers the first semiconductor chip and has an opening to expose the connection pad of the redistribution wiring layer.

In example embodiments, the first mold member may cover the bonding pad of the redistribution wiring layer.

In example embodiments, the first connection member may be provided on a lower surface of a second substrate of the second package and be positioned in the opening to make contact with the connection pad.

According to example embodiments, in a method of manufacturing a semiconductor package, a first package including at least one first semiconductor chip mounted on a first substrate is prepared. A redistribution wiring layer is formed on the first semiconductor chip. The redistribution wiring layer includes a connection pad, a bonding pad electrically connected to the connection pad and a dummy bonding pad electrically connected to the bonding pad. The bonding pad is electrically connected to the first substrate using a bonding wire. The dummy bonding pad is electrically connected to the first substrate using a dummy boding wire. A test signal is applied between the dummy bonding wire and the bonding wire to detect a defect of the bonding wire. A second package is stacked on the first package via the redistribution wiring layer such that the second package is electrically connected to the connection pad of the redistribution wiring layer by a first connection member.

In example embodiments, stacking the second package may proceed when no defect of the boding wire is detected.

In example embodiments, forming the redistribution wiring layer may include forming a conductive line that electrically connects the bonding pad and the dummy bonding pad.

In example embodiments, forming the redistribution wiring layer may include forming a first conductive line that electrically connects the connection pad and the bonding pad and forming a second conductive line that electrically connect the connection pad and the dummy bonding pad.

In example embodiments, electrically connecting the bonding pad to the first substrate may include connecting the bonding wire to a substrate pad of the first substrate and connecting the dummy bonding wire to a dummy substrate pad of the first substrate.

According to example embodiments, a semiconductor package includes a first package including a first substrate and a plurality of semiconductor chips stacked on each other on the first substrate, a redistribution wiring layer on an uppermost semiconductor chip of the plurality of semiconductor chips and including a connection pad, a bonding pad electrically connected to the connection pad and a dummy bonding pad electrically connected to the bonding pad, a second package stacked on the first package, the second package including a second substrate, and a connection member formed on a lower surface of the second substrate, wherein the connection member contacts and is electrically connected to the connection pad, a bonding wire electrically connecting the bonding pad to a substrate pad on the first substrate, and a dummy bonding wire electrically connecting the dummy bonding pad to a dummy substrate pad on the first substrate.

According to example embodiments, a semiconductor package may include a first package and a second package stacked on the first package via a redistribution wiring layer. The second package may be electrically connected to a first substrate of the first package by a bonding pad of the redistribution wiring layer and a bonding wire. The redistribution wiring layer may include the bonding pad and a dummy bonding pad electrically connected to the bonding pad by a redistribution conductive wire. The dummy bonding pad may be electrically connected to the first substrate by a dummy bonding wire.

Accordingly, the dummy bonding wire may be electrically connected to the bonding wire through the dummy bonding pad and the bonding pad of the redistribution wiring layer to provide a closed dummy circuit. Before stacking the second package on the first package, the dummy circuit may be used to detect a defect of the bonding wire.

Thus, before the second package is stacked on the first package, a defect of the bonding wire for electrically connecting the second package and an external device may be detected to determine whether or not a next step of the manufacturing process (e.g., a process of stacking the second package) proceeds.

BRIEF DESCRIPTION OF THE DRAWINGS

Example embodiments will be more clearly understood from the following detailed description taken in conjunction with the accompanying drawings. FIGS. 1 to 15 represent non-limiting, example embodiments as described herein.

FIG. 1 is a cross-sectional view illustrating a semiconductor package in accordance with an example embodiment.

FIG. 2 is a cross-sectional view illustrating a first package and a redistribution wiring layer of the semiconductor package in FIG. 1.

FIG. 3 is a plan view illustrating the first package and the redistribution wiring layer in FIG. 2.

FIG. 4 is a perspective view illustrating the first package and the redistribution wiring layer in FIG. 2.

FIG. 5 is a cross-sectional view illustrating a second package of the semiconductor package in FIG. 1.

FIGS. 6 to 15 are views illustrating a method of manufacturing a semiconductor package in accordance with an example embodiment.

DETAILED DESCRIPTION OF EXAMPLE EMBODIMENTS

Figure 1:
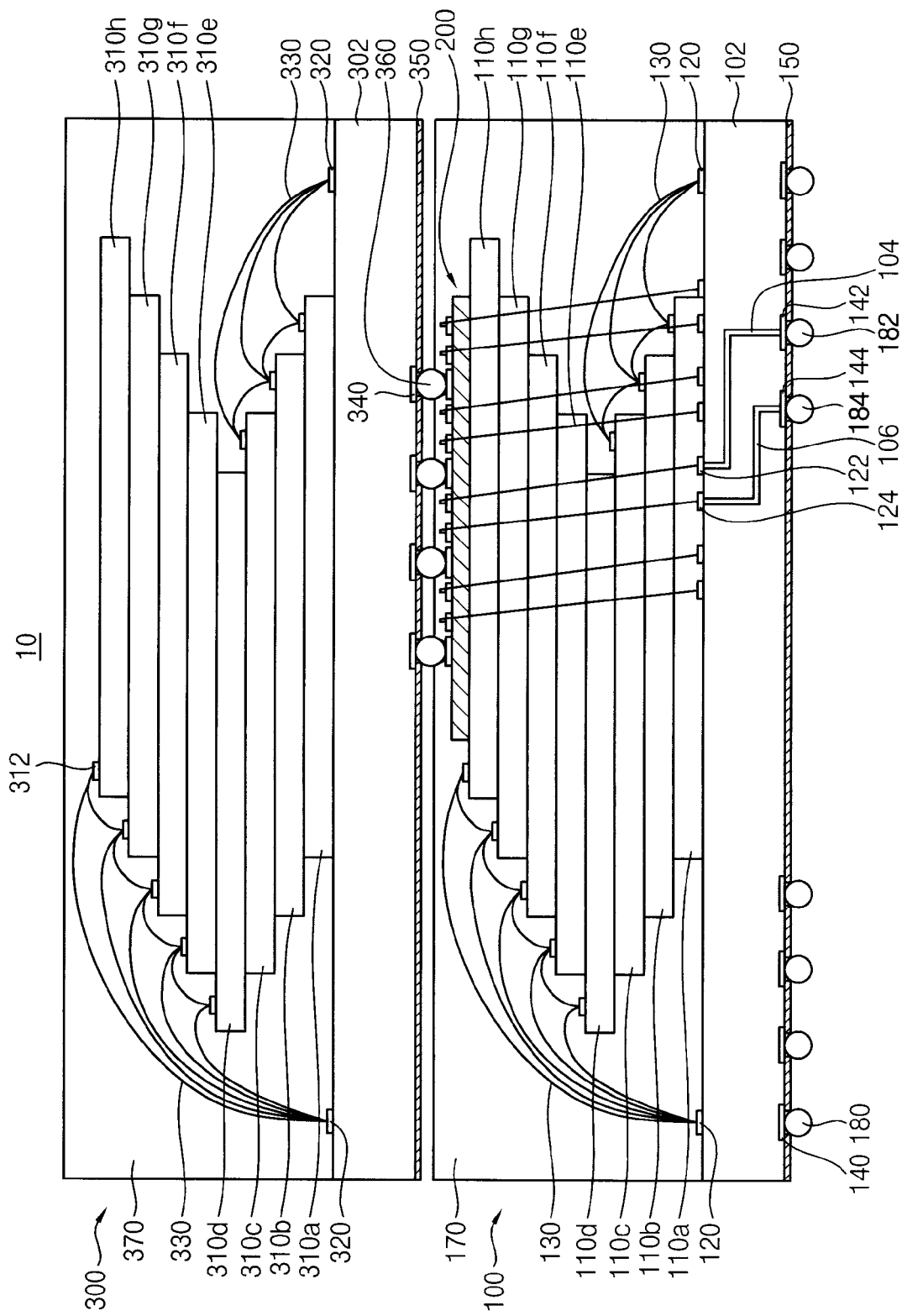

Various example embodiments will be described more fully hereinafter with reference to the accompanying drawings, in which example embodiments are shown. Example embodiments may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Figure 2:
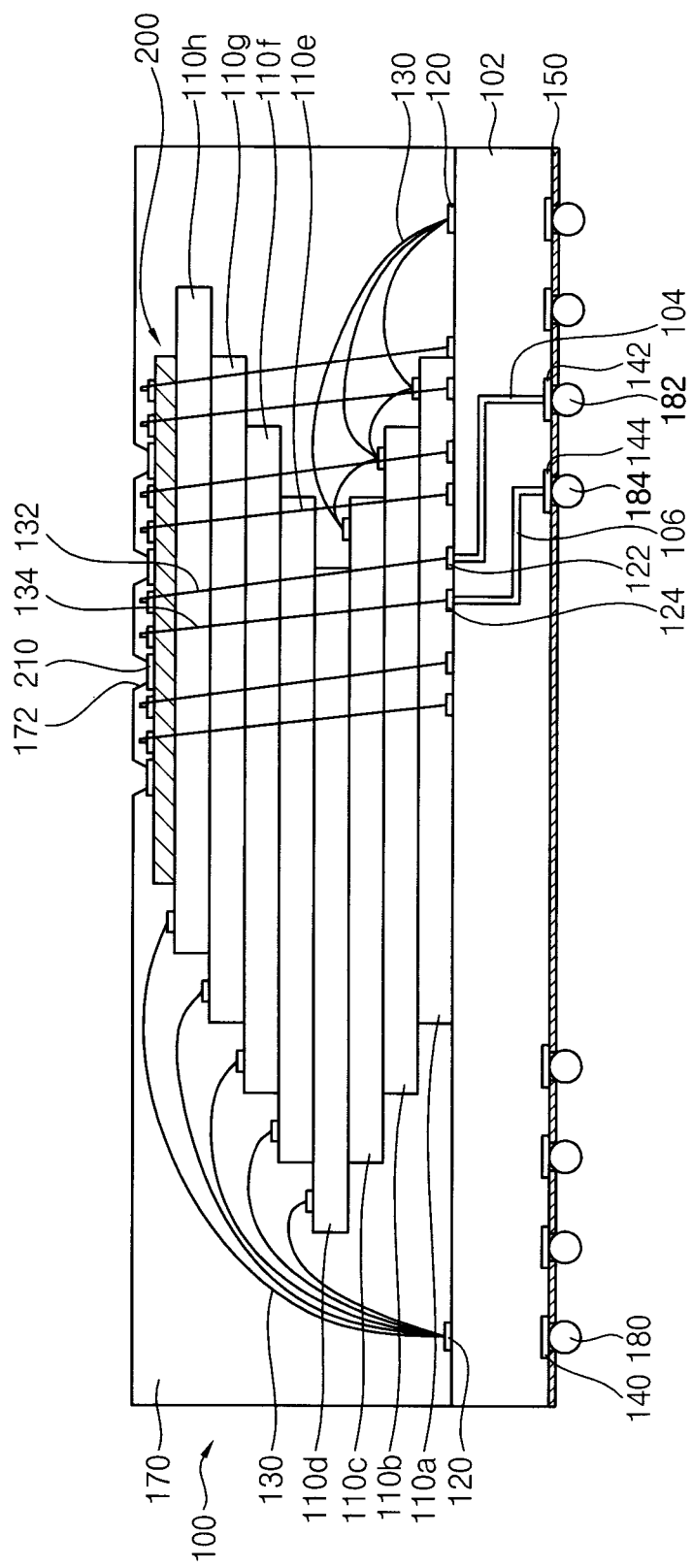
Figure 3:
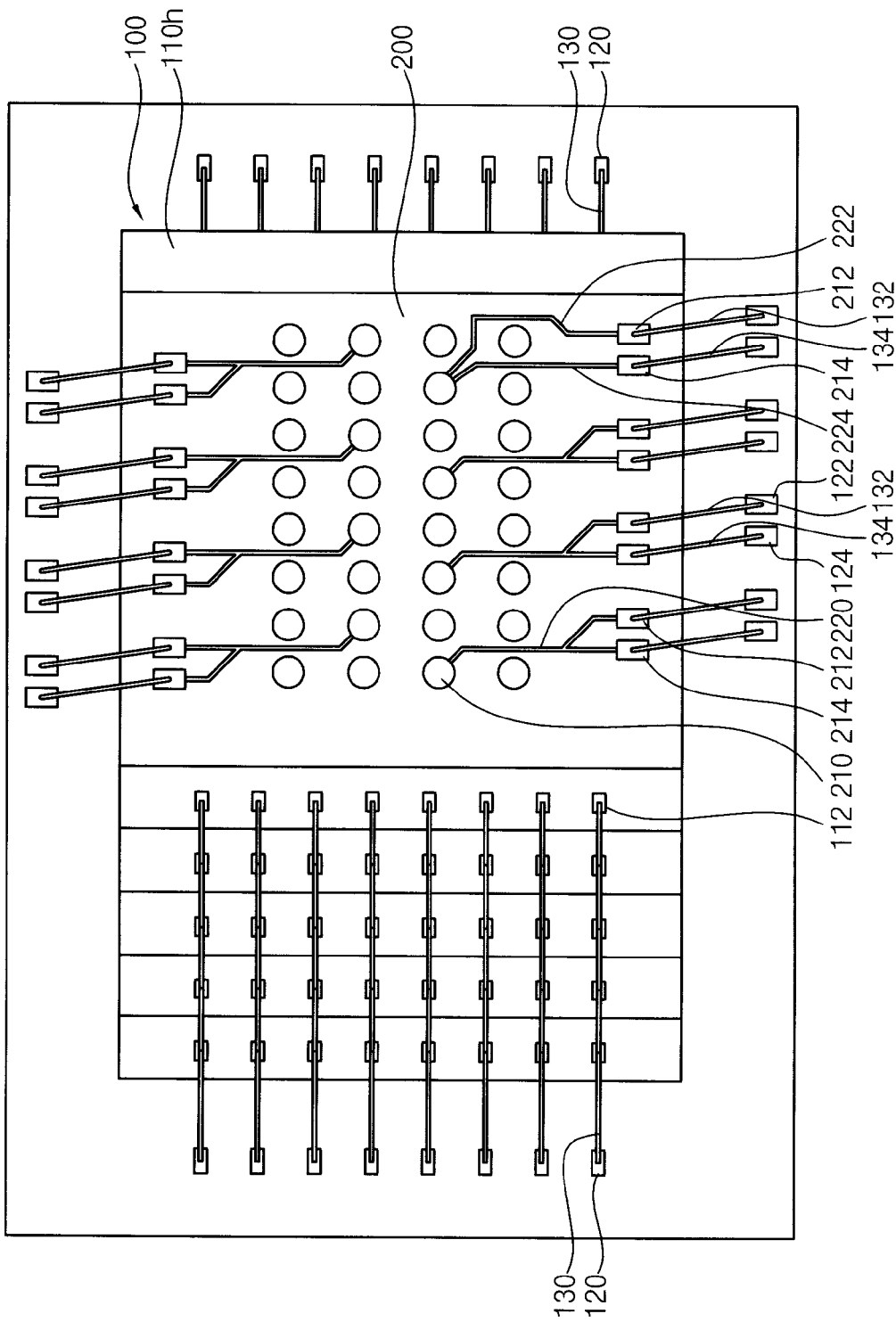
Figure 4:
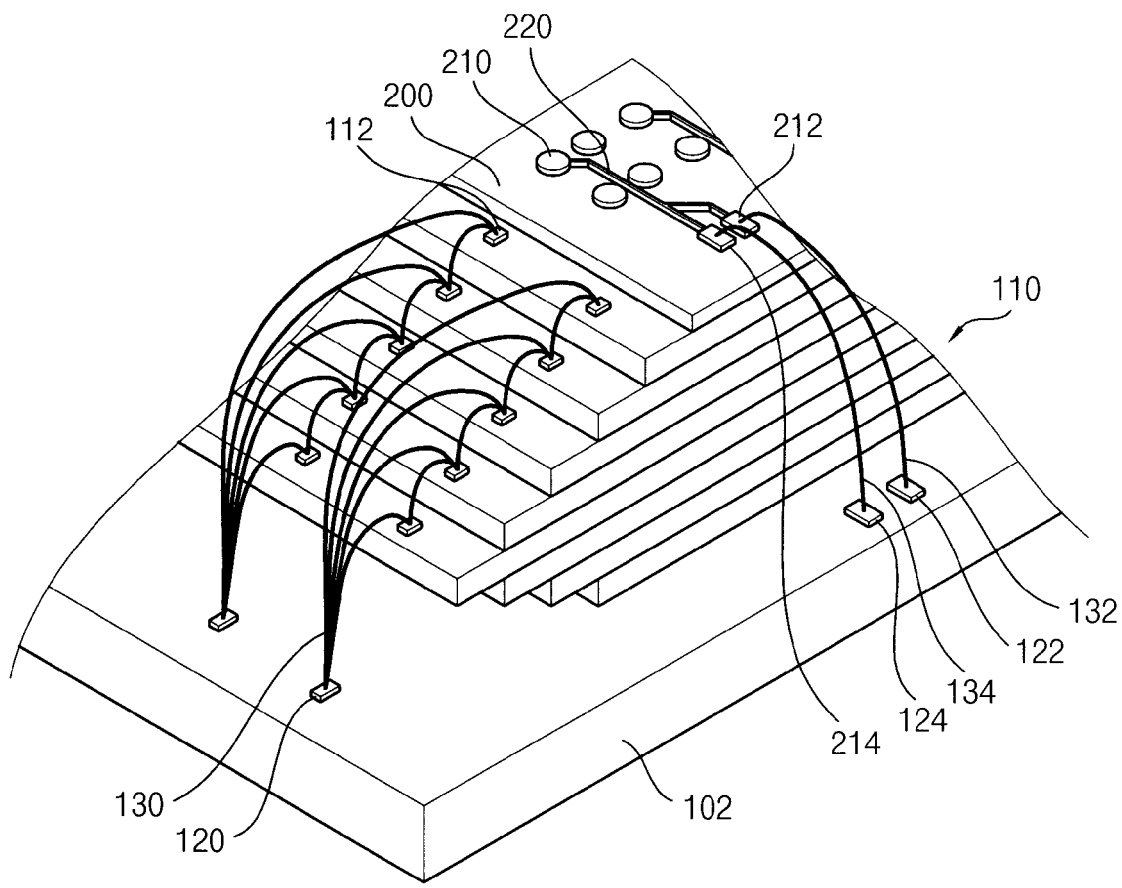
Figure 5:
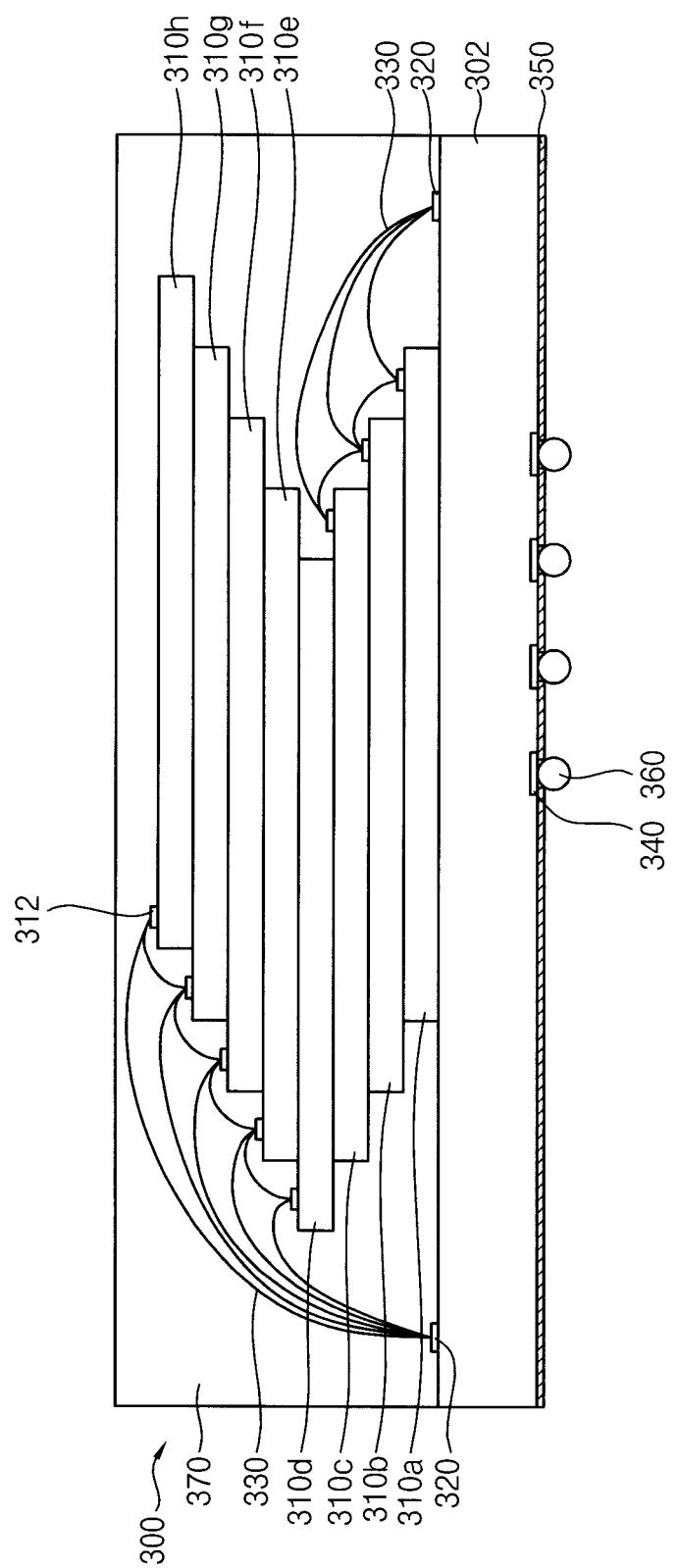

FIG. 1 is a cross-sectional view illustrating a semiconductor package in accordance with an example embodiment. FIG. 2 is a cross-sectional view illustrating a first package and a redistribution wiring layer of the semiconductor package in FIG. 1. FIG. 3 is a plan view illustrating the first package and the redistribution wiring layer in FIG. 2. FIG. 4 is a perspective view illustrating the first package and the redistribution wiring layer in FIG. 2. FIG. 5 is a cross-sectional view illustrating a second package of the semiconductor package in FIG. 1.

Referring to FIGS. 1 to 5, a semiconductor package 10 according to an example embodiment includes a first package 100, a redistribution wiring layer 200, a second package 300 stacked on the first package 100 and electrically connected to the redistribution wiring layer 200, a plurality of bonding wires 132 electrically connecting the redistribution wiring layer 200 to the first package 100, and a dummy circuit for detecting a defect of the bonding wires 132.

In an example embodiment, the first package 100 includes a first substrate 102 and at least one first semiconductor chip 110 mounted on the first substrate 102. A plurality of first semiconductor chips 110a-110h are shown in FIGS. 1, 2 and 4.

The first substrate 102 includes an upper surface and a lower surface. For example, according to an embodiment, the first substrate 102 is a printed circuit board (PCB). The PCB may be a multi-layered circuit board having various circuits and vias therein.

First bonding pads 120 for electrically connecting the first semiconductor chips 110 with the first substrate are formed on the upper surface of the first substrate 102. Outer connection pads 140 for electrical connection with an external device are formed on the lower surface of the first substrate 102.

According to embodiments, the first semiconductor chips include a plurality of circuit elements therein, such as, for example, a plurality of memory devices. Examples of the memory devices include a volatile memory device and a non-volatile memory device. Examples of the volatile memory device may be DRAM, SRAM, etc. Examples of the non-volatile memory device may be EPROM, EEPROM, Flash EEPROM, etc.

The first semiconductor chips 110a to 110h may be stacked like steps in staircases to form stepped portions on which chip pads 112 of the first semiconductor chips are exposed. In other words, the chip pads 112 are arranged on the stepped portions. However, the number and shape of the stacked first semiconductor chips should not be construed as limited to what is shown in FIGS. 1-5.

The first semiconductor chips 110a-110h are electrically connected to the first substrate 102 by a plurality of first wires 130. The first wires 130 are drawn from the first bonding pads 120 to extend from the first bonding pads 120 to be connected to the chip pads 112 of the first semiconductor chips, respectively. The first wires further connect the chip pads of the stacked first semiconductor chips to one another. As can be seen a plurality of first wires 130 can extend from the same bonding pad 120.

According to an embodiment, the first bonding pad 120 on the upper surface of the first substrate 102 is electrically connected to the outer connection pad 140 on the lower surface of the first substrate 102 through inner wiring of the first substrate. A connection member 180 for electrical connection with an external device is disposed on the outer connection pad 140 on the lower surface of the first substrate 102. For example, the connection member 180 may include a solder ball or a solder bump.

Accordingly, the first semiconductor chip 110 may be electrically connected to an external device through the connection member 180. An electrical signal may be inputted/outputted to/from the first package 100 through the connection member 180.

In an example embodiment, the redistribution wiring layer 200 is formed on the first package 100 and the second package 300 is stacked on the first package 100 via the redistribution wiring layer 200.

The redistribution wiring layer 200 is formed on the uppermost first semiconductor chip 110h. The redistribution wiring layer 200 includes a connection pad 210 for electrical connection with the second package 300 and a bonding pad 212 for electrical connection with the first substrate 102. According to an embodiment, the bonding pad 212 is electrically connected to the connection pad 210.

A substrate pad 122 for electrical connection with a bonding pad 212 of the redistribution wiring layer 200 is formed on the upper surface of the first substrate 102. The first substrate is electrically connected to the bonding pad 212 of the redistribution wiring layer 200 by a bonding wire 132.

The bonding wire 132 is drawn from and extends from the substrate pad 122 of the first substrate 102 to be connected to the bonding pad 212 of the redistribution wiring layer 200.

The second package 300 includes a second substrate 302 and at least one second semiconductor chip 310 mounted on the second substrate 302. Referring to FIGS. 1 and 5, according to an embodiment, a plurality of semiconductor chips 310a-310h are on the second substrate 302. According to an embodiment, the second package 300 includes the same or like elements as those of the first package 100.

The second package 300 is stacked on the first package 100 via the redistribution wiring layer 200. For example, the second package 300 may be a ball grid array (BGA) package. A plurality of first connection members 360 are disposed on a lower surface of a second substrate 302 of the second package 300. According to an embodiment, a first connection member 360 makes contact with a connection pad 210 of the redistribution wiring layer 200 to be electrically connected to the redistribution wiring layer 200. A first connection member 360 may include a solder ball or a solder bump.

Accordingly, the second package 300 is electrically connected to a connection pad 210 of the redistribution wiring layer 200 by a first connection member 360. A bonding pad 212 of the redistribution wiring layer 200 is electrically connected to a substrate pad 122 of the first substrate 102 by a bonding wire 132.

The substrate pad 122 on the upper surface of the first substrate 102 is electrically connected to a first outer connection pad 142 on the lower surface of the first substrate 102. A second connection member 182 for electrical connection with an external device IS disposed on the first outer connection pad 142 on the lower surface of the first substrate 102. For example, the second connection member 182 may include a solder ball or a solder bump.

Accordingly, a second semiconductor chip 310 is electrically connected to an external device by the first connection member 360, the connection pad 210 and the bonding pad 212 of the redistribution wiring layer 200, the bonding wire 132 and the second connection member 182. An electrical signal may be inputted/outputted to/from the second package 300 through the second connection member 182, the bonding wire 132, the redistribution wiring layer 200 and the first connection member 360. Like connection member 180 of the first package 100, the connection member 360 of the second package 300 is connected to the connection pad 340, which, in turn is connected to the bonding pad 320 via internal connections through the second substrate 302. Similar to the first package 100, the bonding pads 312 and 320 are electrically connected to each other via wires 330.

In an example embodiment, a dummy circuit includes a dummy bonding pad 214. The dummy bonding pad 214 is formed on the redistribution wiring layer 200 to be electrically connected to the bonding pad 212 of the redistribution wiring layer 200.

For example, the dummy bonding pad 214 is electrically connected to the bonding pad 212 of the redistribution wiring layer 200 by a conductive line 220. Alternatively, referring to FIG. 3, the connection pad 210 is connected to the bonding pad 212 by a first conductive line 222 and is connected to the dummy bonding pad 214 by a second conductive line 224. Accordingly, the dummy bonding pad 214 is electrically connected to the bonding pad 212 by the first conductive line 222 and the second conductive line 224.

A dummy substrate pad 124 for electrical connection with the dummy bonding pad 214 of the redistribution wiring layer 200 is formed on the upper surface of the first substrate 102. The first substrate 102 is electrically connected to the dummy bonding pad 214 of the redistribution wiring layer 200 by a dummy bonding wire 134. The dummy bonding wire 134 is drawn and extends from the dummy substrate pad 124 to be connected to the dummy bonding pad 214 of the redistribution wiring layer.

The dummy substrate pad 124 on the upper surface of the first substrate 102 is electrically connected to a second outer connection pad 144 on the lower surface of the first substrate 102. A dummy connection member 184 is disposed on the second outer connection pad 144 on the lower surface of the first substrate 102. For example, the dummy connection member 184 may include a solder ball or a solder bump.

Accordingly, the dummy bonding wire 134 is electrically connected to the bonding wire 132 through the dummy bonding pad 214 and the bonding pad 212 to provide a closed dummy circuit.

In an example embodiment, before stacking the second package 300 on the redistribution wiring layer 200, the dummy circuit may be used to detect a defect of the bonding wire 132. According to an embodiment, the dummy bonding pad 214 is electrically connected to the bonding pad by the conductive line 220. Alternatively, the dummy bonding pad 214 is electrically connected to the bonding pad 212 by the first conductive line 222 and the second conductive line 224. In either case, the dummy circuit is used to detect a defect of the bonding wire 132 and the conductive line 220, or the conductive lines 222 and 224.

For example, a test signal may flow from the second connection member 182 to the dummy connection member 184 through the bonding wire 132, the bonding pad 212 and the dummy bonding pad 214 of the redistribution wiring layer 200 and the dummy bonding wire 134. According to the embodiment, the dummy connection member 184 is not a functional connection member for electrical connection with the second package 200, but is a dummy connection member for ensuring mechanical reliability with a module substrate where the semiconductor package is mounted.

The first package 100 includes a first mold member 170 to cover the first semiconductor chips 110. The first mold member 170 is formed on the upper surface of the first substrate 102 to protect the first semiconductor chips from external impacts and/or substances. The second package 300 includes a second mold member 370 to cover the second semiconductor chips 310. The first and second mold members include, for example, epoxy molding compound (EMC).

The first mold member 170 covers the redistribution wiring layer 200 on the uppermost first semiconductor chip 110h. The first mold member 170 includes an opening 172 to expose the connection pad 210 of the redistribution wiring layer 200. The first mold member 170 covers the redistribution wiring layer 200 without covering the connection pads 210.

Accordingly, the bonding pads 212 of the redistribution wiring layer 200 are covered by the first molding member 170 and the connection pads 210 of the redistribution wiring layer 200 are exposed so that the connection pads can make contact with the connection members 360.

The first connection member 360 is disposed on the lower surface of the second substrate 302 of the second package 300 and positioned in the opening 172 of the first molding member 170 to make contact with the connection pad 210 of the redistribution wiring layer 200. Accordingly, the second package 300 is electrically connected to the connection pad 210 by the first connection member 360.

According to an embodiment, after the second package 300 is stacked on the first package 100 via the redistribution wiring layer 200, the connection members 180 are disposed on the outer connection pads 140 on the lower surface of the first substrate 102, the second connection members 182 are disposed on the first outer connection pads 142, and the dummy connection members 184 are disposed on the second outer connection pads 144. Thus, the first and second packages 100 and 300 may be mounted on a module substrate (not illustrated) via the above members to form a memory module (not illustrated).

Hereinafter, a method of manufacturing the semiconductor package in FIG. 1 will be explained.

FIGS. 6 to 15 are views illustrating a method of manufacturing a semiconductor package in accordance with an example embodiment. FIGS. 6, 8, 10, 12, 14, and 15 are cross-sectional views illustrating a method of manufacturing a semiconductor package in accordance with an example embodiment. FIGS. 7, 9, 11 and 13 are respective plan views of FIGS. 6, 8, 10 and 12.

Figure 6:
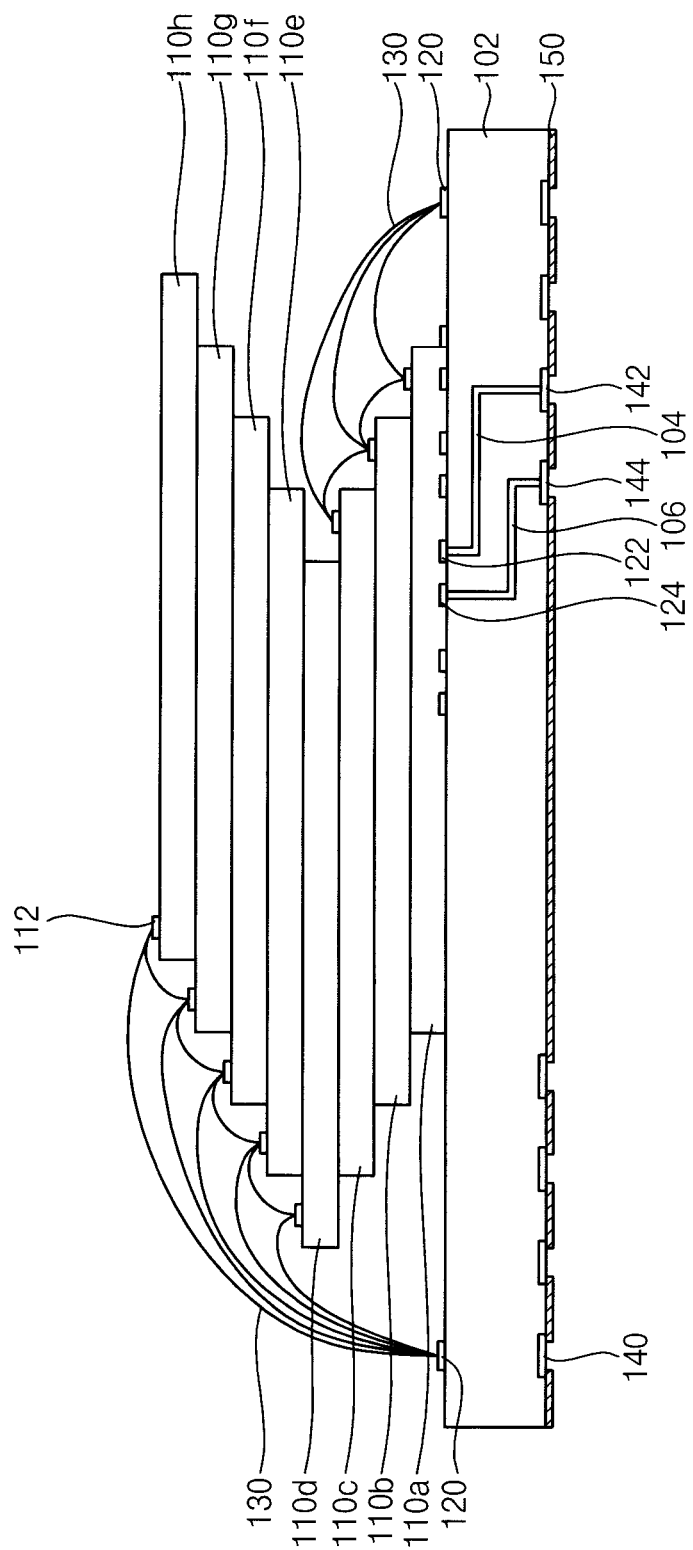
Figure 7:
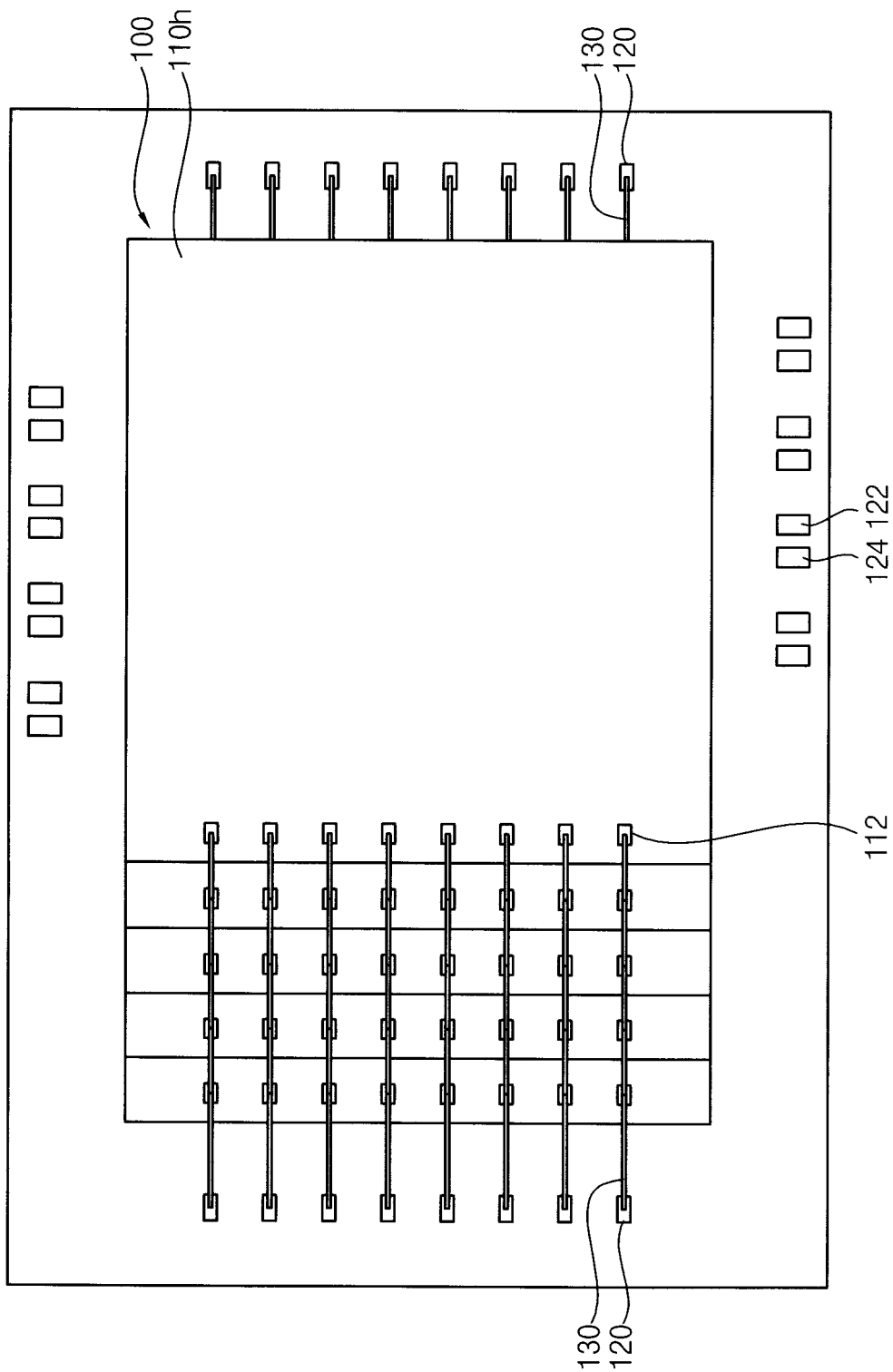

Referring to FIGS. 6 and 7, a first package including at lease one first semiconductor chip 110 mounted on a first substrate 102 is prepared. According to an embodiment, the first package includes a plurality of semiconductor chips 110a-110h.

In an example embodiment, the first substrate 102 may be a printed circuit board (PCB) having an upper surface and a lower surface. A plurality of first bonding pads 120 are formed on the upper surface of the first substrate 102. A plurality of outer connection pads 140 are formed on the lower surface of the first substrate 102. The outer connection pads 140 are exposed through openings in an insulating layer pattern 150. The first bonding pads 120 on the upper surface of the first substrate 102 are electrically connected to the outer connection pads 140 on the lower surface of the first substrate 102 by inner wiring of the first substrate.

A plurality of substrate pads 122 and a plurality of dummy pads 124 are faulted on the upper surface of the first substrate 102. The dummy pads 124 are arranged adjacent to respective substrate pads 122.

The substrate pads 122 are electrically connected to respective first outer connection pads 142 on the lower surface of the first substrate 102 by first wiring 104 of the first substrate. The dummy pads 124 are electrically connected to respective second outer connection pads 144 by second wiring 106 of the first substrate. The first and second outer connection pads 142 and 144 are exposed by openings in the insulating layer pattern 150.

The first bonding pads 120 are arranged along first and second side portions of the substrate 102 opposite to each other. The substrate pads 122 and the dummy pads 124 are arranged along third and fourth side portions of the substrate 102 opposite to each other.

At least one first semiconductor chip 110 is mounted on the upper surface of the first substrate 102. For example, eight first semiconductor chips 110a to 110h are mounted on the upper surface of the first substrate 102. The first semiconductor chips are stacked on the first substrate 102 using adhesive layers (not illustrated) between the semiconductor chips 110a-110h and between the semiconductor chip 110a and the substrate 102.

The first semiconductor chips 110a to 110h are stacked like steps of staircases to form stepped portions that expose chip pads 112 of the first semiconductor chips. Accordingly, the chip pads 112 are arranged on the stepped portion. However, the number and shape of the stacked first semiconductor chips should not be construed as limited what is shown.

The first semiconductor chips are electrically connected to the first substrate 102 using a plurality of first wires 130. By a wire bonding process, the first wires 130 are drawn from the first bonding pads 120 so as to extend from the first bonding pads 120 to be connected to the chip pads 112 of the first semiconductor chips, respectively. The first wires further connect the chip pads of the stacked first semiconductor chips to one another. As can be seen a plurality of first wires 130 can extend from the same bonding pad 120.

Accordingly, the first semiconductor chips 110 are electrically connected to the outer connection pads 140 of the first substrate 102 by the first wires 130 and the first bonding pads 120.

Figure 8:
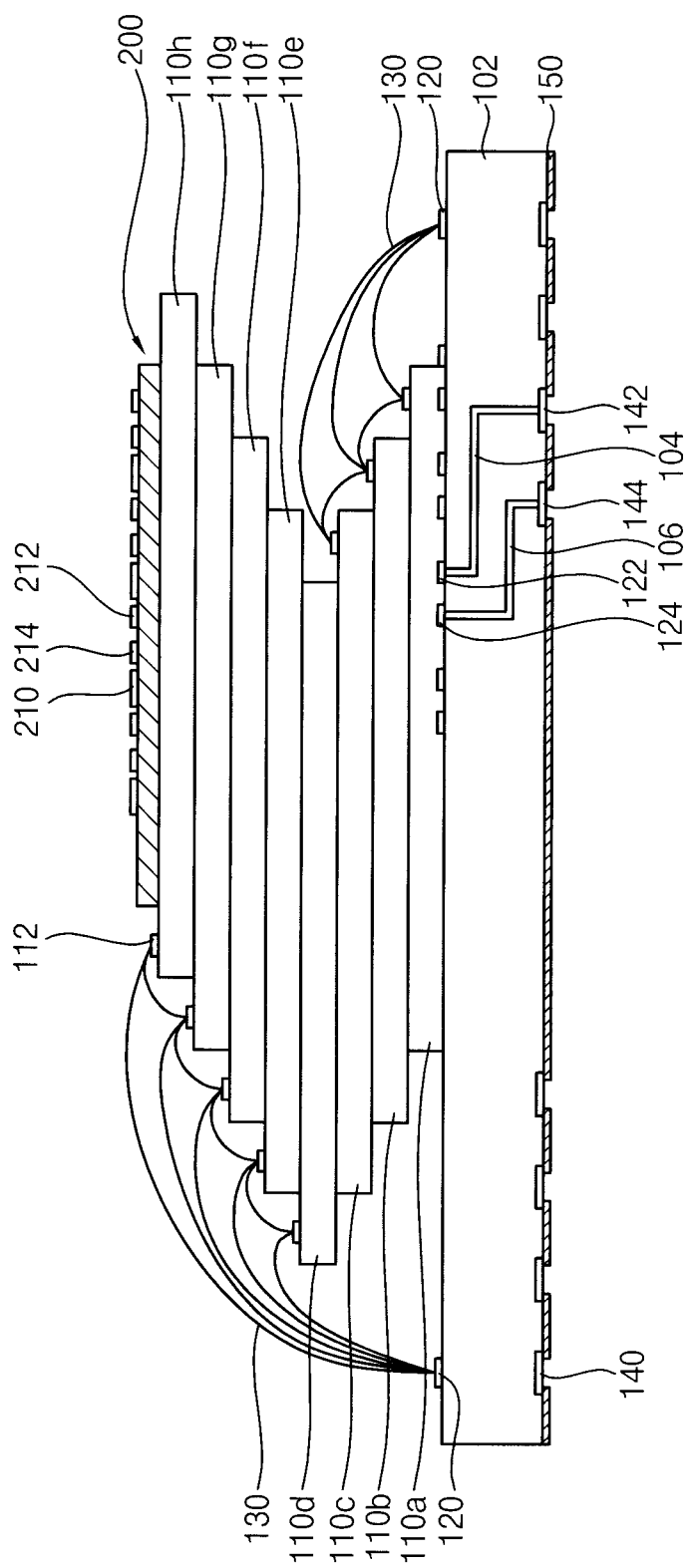
Figure 9:
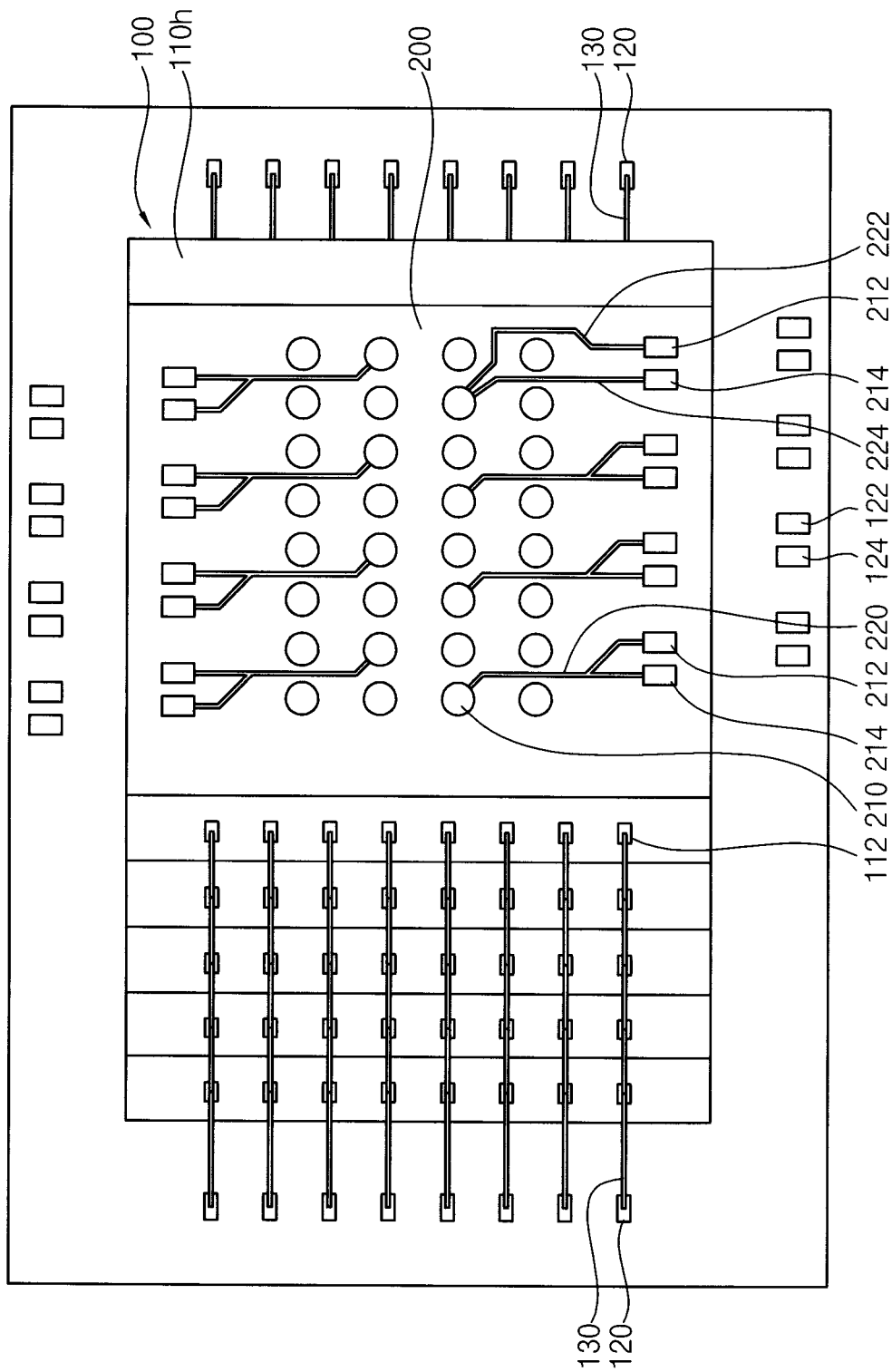

Referring to FIGS. 8 and 9, a redistribution wiring layer 200 is formed on the first semiconductor chips 110.

In an example embodiment, the redistribution wiring layer 200 is formed on the uppermost first semiconductor chip 110h. Alternatively, after the redistribution wiring layer 200 is formed on the first semiconductor chip 110h, the first semiconductor chip 110h having the redistribution wiring layer 200 formed thereon is then stacked on another first semiconductor chip 110g.

The redistribution wiring layer 200 includes connection pads 210, bonding pads 212 electrically connected to the connection pads 210 and a dummy bonding pads 214 electrically connected to the bonding pads 212. The redistribution wiring layer 200 serves as an electrical interconnector between the first package and the second package stacked on the first package.

For example, referring to FIG. 9, a plurality of the connection pads 210 are arranged in a middle region of the redistribution wiring layer 200. A plurality of the bonding pads 212 and the dummy bonding pads 214 are arranged along first and second side portions of the redistribution wiring layer 200 opposite to each other. The bonding pads 212 and the respective dummy bonding pads 214 are arranged adjacent to each other and corresponding to the substrate pads 122 and the dummy pads 124.

A dummy bonding pad 214 is electrically connected to a bonding pad 212 of the redistribution wiring layer 200 by a conductive line 220. Alternatively, a connection pad 210 is connected to a bonding pad 212 by a first conductive line 222 and the connection pad 210 is connected to the dummy bonding pad 214 by a second conductive line 224. Accordingly, the dummy bonding pad 214 is electrically connected to the bonding pad 212 by the first conductive line 222 and the second conductive line 224.

Figure 10:
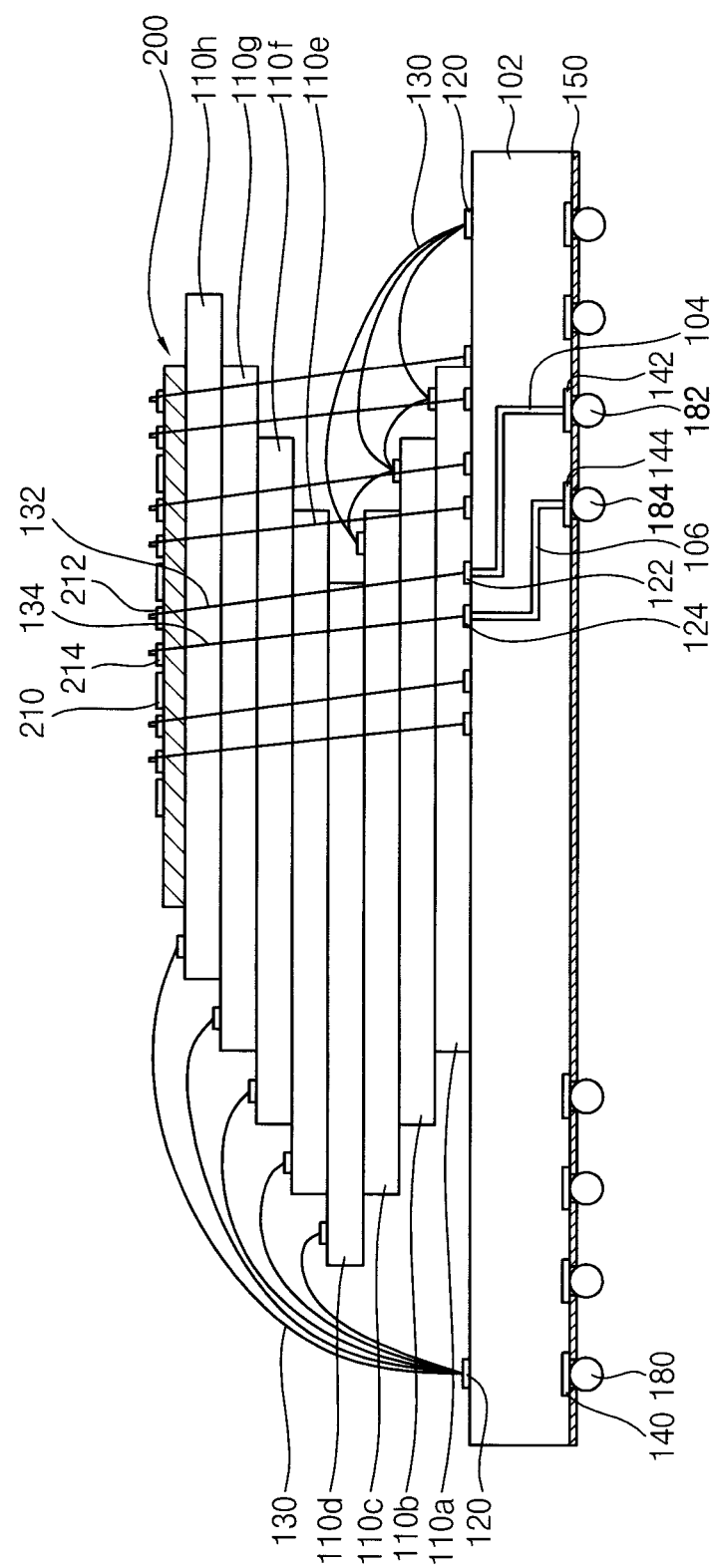
Figure 11:
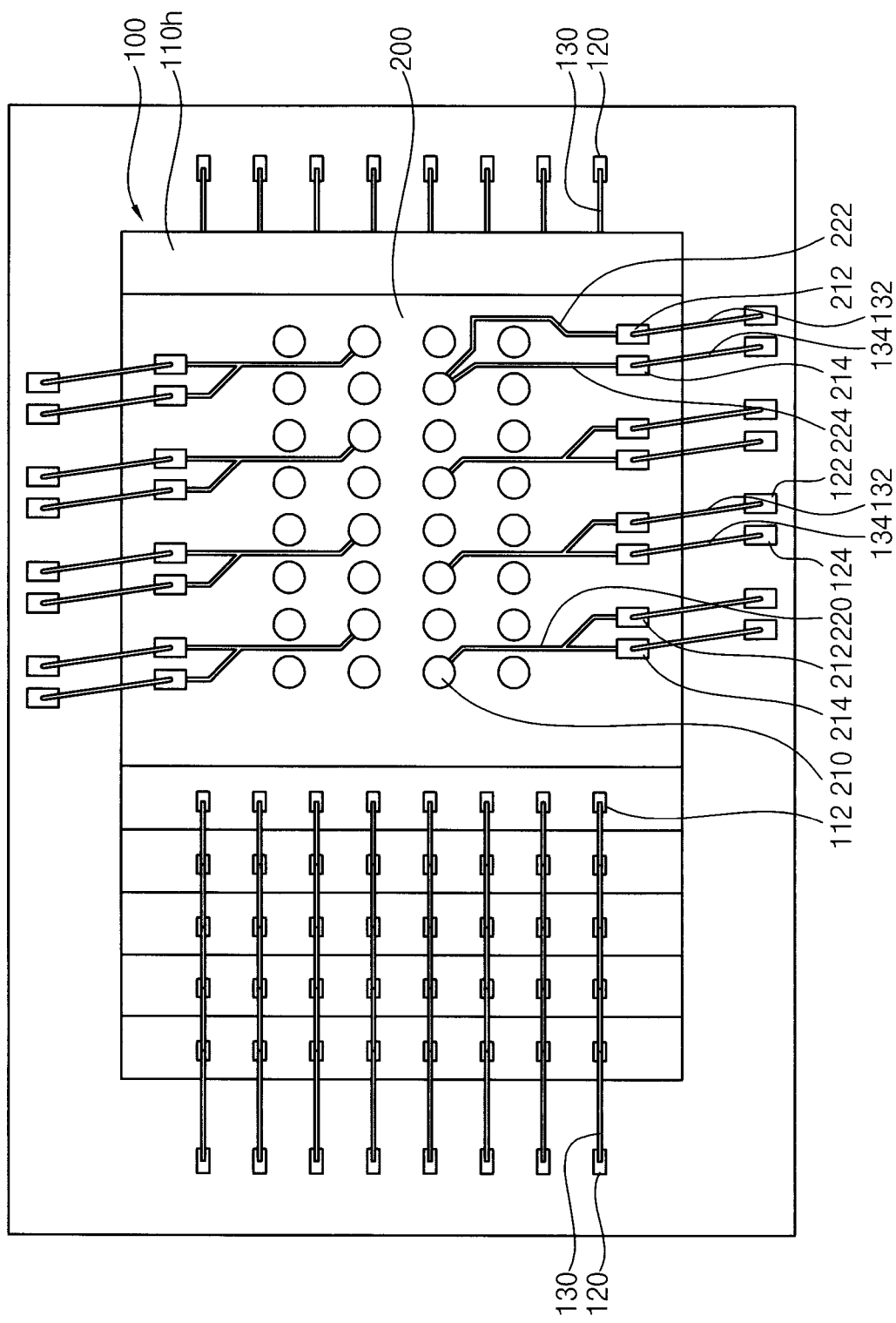

Referring to FIGS. 10 and 11, a wire bonding process is performed such that the first substrate 102 of the first package is electrically connected to the bonding pads 212 using bonding wires 132 and is electrically connected to the dummy bonding pads 214 using dummy bonding wires 134.

In an example embodiment, by a wire bonding process, the bonding wires 132 are drawn and extend from the substrate pads 122 of the first substrate 102 to be connected to the bonding pads 212 of the redistribution wiring layer 200, respectively. Additionally, the dummy bonding wires 134 are drawn and extend from the dummy pads 124 of the first substrate 102 to be connected to the dummy bonding pads 214 of the redistribution wiring layer 200, respectively.

Accordingly, the connection pads 210 of the redistribution wiring layer 200 are electrically connected to the first outer connection pads 142 of the first substrate 102 by the bonding pads 212, the bonding wires 132 and the substrate pads 122. The dummy bonding pads 214 of the redistribution wiring layer 200 are electrically connected to the second outer connection pads 144 of the first substrate 102 by the dummy bonding wires 134 and the dummy bonding substrate pads 124.

Thus, the dummy bonding wires 134 are electrically connected to the bonding wires 132 through the dummy bonding pads 214 and the bonding pads 212 to provide a closed dummy circuit.

Then, a test signal is applied between a dummy bonding wire 134 and a bonding wire 132 to detect a defect of the bonding wire 132.

In an example embodiment, before inspecting the bonding wires 132, connection members are disposed on the outer connection pads 140, the first outer connection pads 142 and the second outer connection pads 144 on the lower surface of the first substrate 102, respectively. For example, the connection members may include a solder ball or a solder bump.

In particular, connection members 180 are disposed on the outer connection pads 140, second connection members 182 are disposed on the first outer connection pads 142, and dummy connection members 184 are disposed on the second outer connection pads 144.

The second connection member 182 and the dummy connection member 184 are used to inspect a bonding wire 132. For example, a test signal flows from the second connection member 182 to the dummy connection member 184 through the bonding wire 132, the bonding pad 212 and the dummy bonding pad 214 of the redistribution wiring layer 200 and the dummy bonding wire 134.

Here, the dummy connection member 184 is not a functional connection member for electrical connection with the second package, but is a dummy connection member for ensuring mechanical reliability with a module substrate (not illustrated) where the semiconductor package is mounted.

Accordingly, the dummy circuit detects a defect of the bonding wire 132. Further, the dummy circuit detects a defect of the conductive line (second conductive line 222). When no defects are detected, the manufacturing process may proceed.

Alternatively, the first outer connection pad 142 and the second outer connection pad 144 may be used to inspect the bonding wire 132. For example, a test signal may flow from the first outer connection pad 142 to the second outer connection pad 144 through the bonding wire 132, the bonding pad 212 and the dummy bonding pad 214 of the redistribution wiring layer 200 and the dummy bonding wire 134.

Figure 12:
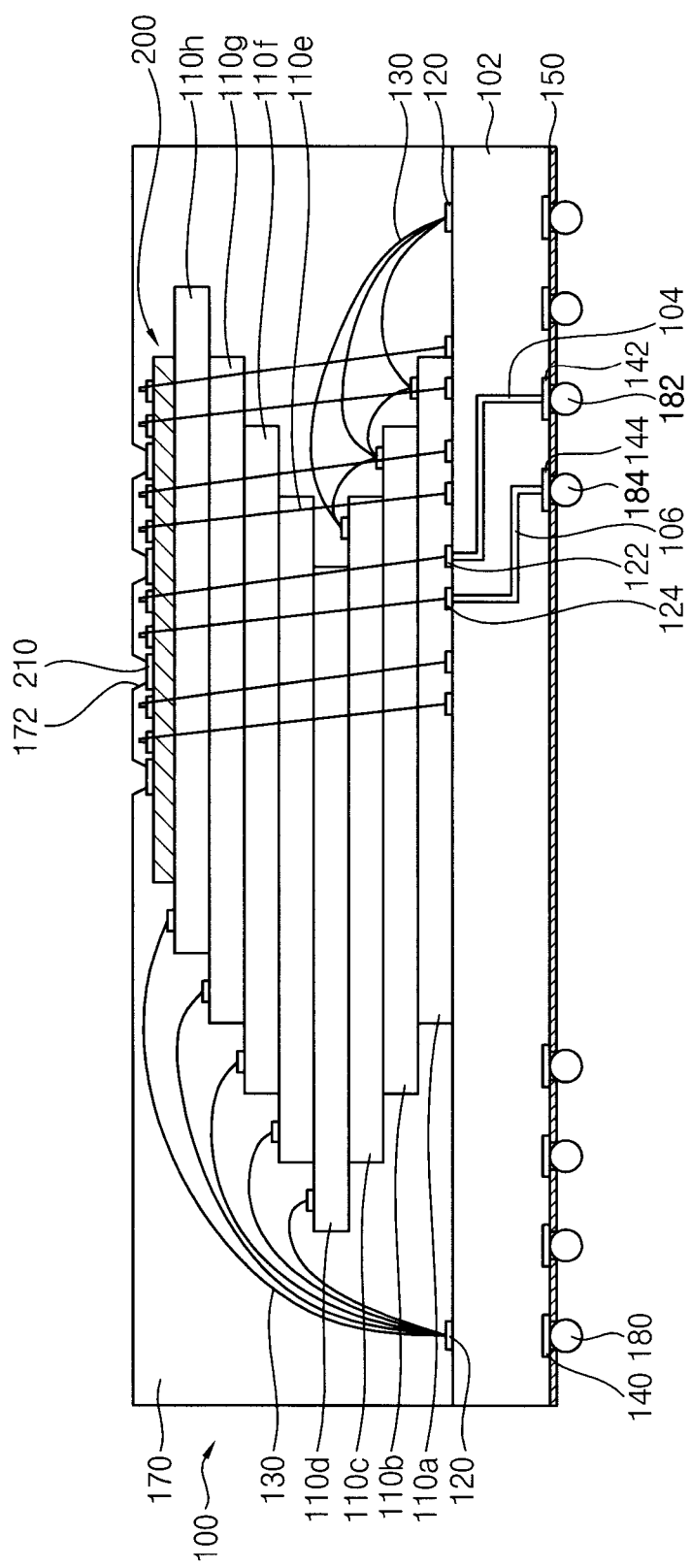
Figure 13:
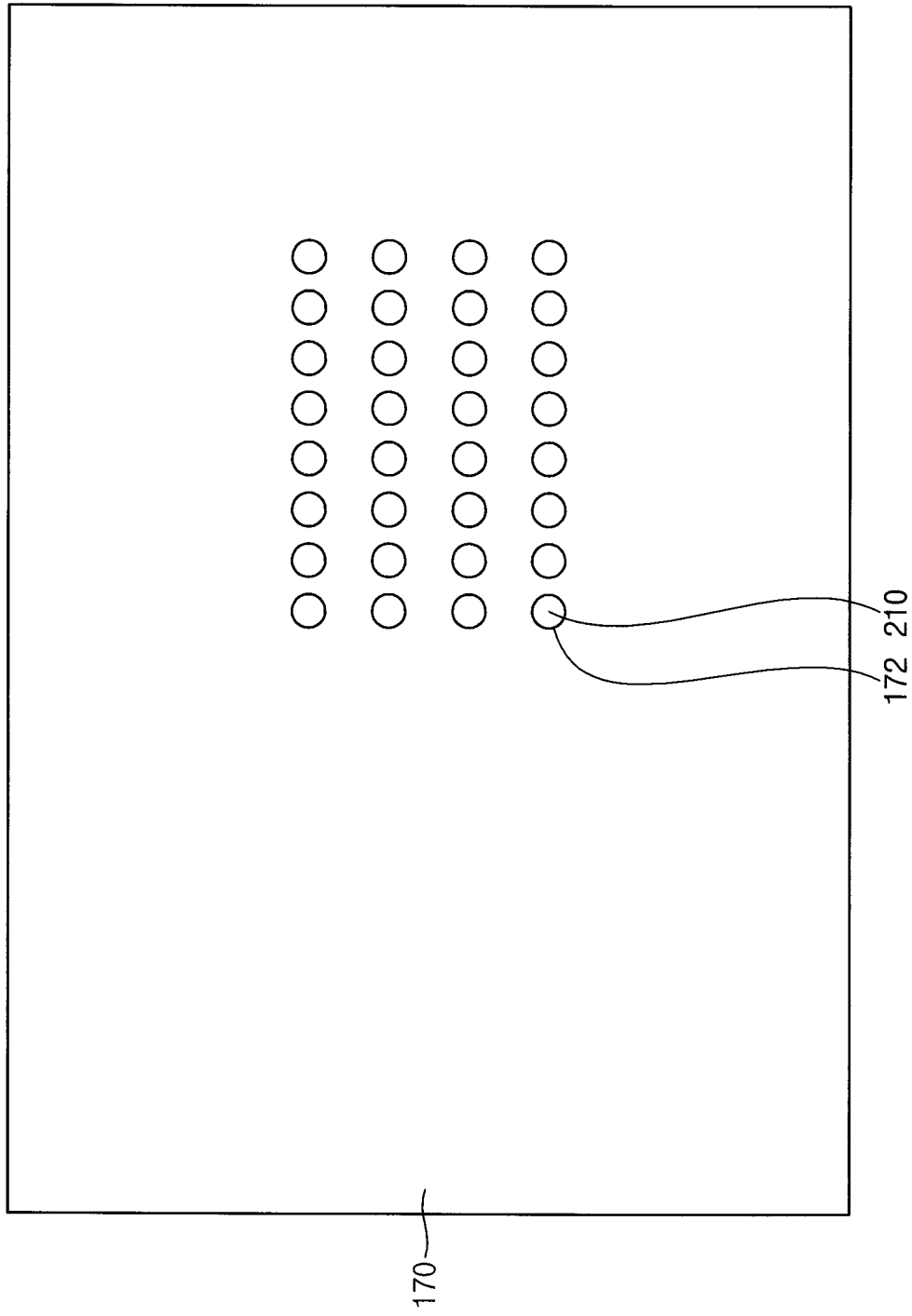

Referring to FIGS. 12 and 13, a first mold member 170 is formed on the first substrate 102 to cover the first semiconductor chips 110.

In an example embodiment, after a mold layer is formed on the upper surface of the first substrate 102, the mold layer is patterned to form the first mold member 170 having openings 172 that expose the connection pads 210 of the redistribution wiring layer 200.

The first mold member 170 may be formed using epoxy molding compound (EMC). The first mold member 170 may be formed by a laser drilling process. Accordingly, the opening 172 formed by a laser drilling process has a tapered side wall.

Figure 14:
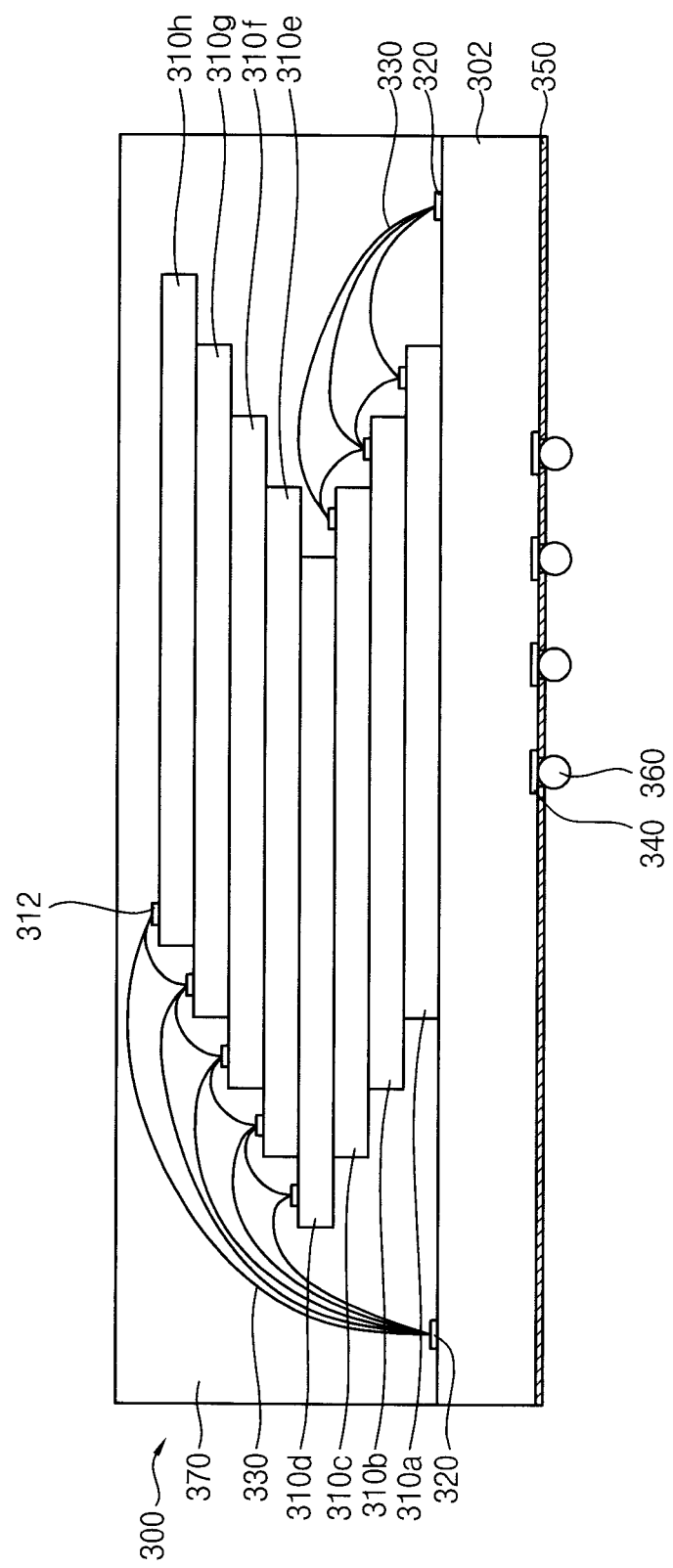

Referring to FIG. 14, a second package including at lease one second semiconductor chip 310 mounted on a second substrate 302 is prepared. According to an embodiment, a plurality of semiconductor chips 310a-310h are formed.

In an example embodiment, the second substrate 302 is a PCB having an upper surface and a lower surface. A plurality of second bonding pads 320 are formed on the upper surface of the second substrate 302. A plurality of outer connection pads 340 are formed on the lower surface of the second substrate 302. The outer connection pads 340 are exposed by openings in an insulating layer pattern 350. The second bonding pads 320 on the upper surface of the second substrate 302 are electrically connected to the outer connection pads 340 on the lower surface of the second substrate 302 by inner wiring of the second substrate.

At least one second semiconductor chip 310 is mounted on the upper surface of the second substrate 302. For example, eight second semiconductor chips 310a to 310h are mounted on the upper surface of the second substrate 302. The second semiconductor chips are stacked on the second substrate 302 by adhesive layers (not illustrated) formed between the second semiconductor chips 310a-310h and between the second semiconductor chip 310a and the second substrate 302.

The second semiconductor chips 310a to 310h are stacked like steps of staircases to form stepped portions including chip pads 312 on exposed surfaces of the second semiconductor chips. Accordingly, the chip pads 312 are arranged on the stepped portion. The number and shape of the stacked second semiconductor chips should not be construed as limited to what is shown.

The second semiconductor chips are electrically connected to the second substrate 302 using by a plurality of second wires 330. By a wire bonding process, the second wires 330 are drawn and extend from the second bonding pads 320 to be connected to the chip pads 312 of the second semiconductor chips, respectively. The second wires further connect the chip pads of the stacked second semiconductor chips to one another.

Accordingly, the second semiconductor chips 310 are electrically connected to the outer connection pads 340 of the second substrate 302 by the second wires 330 and the second bonding pads 320.

A second mold member 370 is formed on the second substrate 302 to cover the second semiconductor chips 310 and the first connection members 360 are disposed on the outer connection pads 340 on the lower surface of the second substrate 302 of the second package 300. The first connection member may include a solder ball or a solder bump.

Referring to FIG. 15, the second package 300 is stacked on the first package 100 via the redistribution wiring layer 200 to form a semiconductor package 10.

The first connection members 360 on the lower surface of the second substrate 302 are positioned in the openings 172 of the first mold member 170 to make contact with the connection pads 210 of the redistribution wiring layer 200. Accordingly, the second package 300 is electrically connected to the connection pads 210 via the first connection members 360.

The first semiconductor chips 110 are electrically connected to an external device by the connection members 180. An electrical signal is inputted/outputted to/from the first package 100 by a connection member 180. The second semiconductor chips 310 are electrically connected to an external device by the first connection members 360, the connection pads 210 and the bonding pads 212 of the redistribution wiring layer 200, the bonding wires 132 and the second connection members 182. An electrical signal is inputted/outputted to/from the second package 300 by a second connection member 182, a bonding wire 132, the redistribution wiring layer 200 and a first connection member 360.

In an example embodiment, the dummy boding wire 134 is electrically connected to the bonding wire 132 through the dummy bonding pad 214 and the bonding pad 212 of the redistribution wiring layer 200 to provide a closed dummy circuit. Before stacking the second package 300 on the first package 100 using the redistribution wiring layer 200, the dummy circuit is used to detect a defect of the bonding wire 132. Further, in the case that the dummy bonding pad 214 is electrically connected to the bonding pad 212 by the first conductive line 222 and the second conductive line 224, the dummy circuit is used to detect a defect of the bonding wire 132 and the conductive lines 222, 224.

In a process of inspecting the boding wire 132, a test signal flows from the second connection member 182 to the dummy connection member 184 through the bonding wire 132, the bonding pad 212 and the dummy bonding pad 214 of the redistribution wiring layer 200 and the dummy bonding wire 134. Accordingly, after testing for a defect of the bonding wire 132, when a defect is not detected, a manufacturing process proceeds.

According to an embodiment, after the second package 300 is stacked on the first package 100 via the redistribution wiring layer 200, the connection members 180 are disposed on the outer connection pads 140 on the lower surface of the first substrate 102, the second connection members 182 are disposed on the first outer connection pads 142, and the dummy connection members 184 are disposed on the second outer connection pads 144. Thus, the first and second packages 100 and 300 are mounted on a module substrate (not illustrated) via the above members to form a memory module (not illustrated).

A semiconductor package according to example embodiments may be applicable to an electronic device such as a cellular phone. For example, the semiconductor package including stacked packages having the same or different types of semiconductor chips may be mounted in the cellular phone to provide various functions. Examples of the electronic devices to which the semiconductor package may be applied are laptops, PMPs, MP3 players, camcorders, memory cards, etc.

As mentioned above, a semiconductor package in accordance with example embodiments includes a first package and a second package stacked on the first package via a redistribution wiring layer. The second package is electrically connected to a first substrate of the first package by bonding pads of the redistribution wiring layer and bonding wires. The redistribution wiring layer includes the bonding pads and dummy bonding pads electrically connected to the bonding pads by redistribution conductive wires. The dummy bonding pads are electrically connected to the first substrate by dummy bonding wires.

Accordingly, a dummy bonding wire is electrically connected to a bonding wire through a dummy bonding pad and the bonding pad of the redistribution wiring layer to provide a closed dummy circuit. Before stacking the second package on the first package using the redistribution wiring layer, the dummy circuit may be used to detect a defect of the bonding wire.

Thus, before the second package is stacked on the first package, a defect of the bonding wire for electrically connecting the second package and an external device may be detected to determine whether or not a following process (e.g., a process of stacking the second package) proceeds.

The foregoing is illustrative of example embodiments and is not to be construed as limiting thereof. Although a few example embodiments have been described, those skilled in the art will readily appreciate that many modifications are possible in example embodiments without materially departing from the novel teachings of the present invention. Accordingly, all such modifications are intended to be included within the scope of example embodiments as defined in the claims.

What is claimed is:

1. A semiconductor package, comprising:
   a first package including a first substrate and at least one semiconductor chip mounted on the first substrate;
   a redistribution wiring layer disposed above the first package and including a connection pad, a bonding pad electrically connected to the connection pad and a dummy bonding pad electrically connected to the bonding pad;
   a second package stacked on the first package via the redistribution wiring layer and electrically connected to the connection pad through a first connection member;
   a bonding wire extending from the bonding pad to a substrate pad disposed on an upper surface of the first substrate of the first package, wherein the bonding wire is connected to the substrate pad and electrically connects the bonding pad to the first substrate; and
   a dummy bonding wire extending from the dummy bonding pad to a dummy substrate pad disposed on the upper surface of the first substrate of the first package, wherein the dummy bonding wire is connected to the dummy substrate pad and electrically connects the dummy bonding pad to the first substrate, and wherein the dummy bonding wire is electrically connected to the bonding wire throw the dummy bonding pad and the bonding pad to provide a closed dummy circuit.

2. The semiconductor package of claim 1, wherein the redistribution wiring layer comprises a conductive line that electrically connects the bonding pad and the dummy bonding pad.

3. The semiconductor package of claim 1, wherein the redistribution wiring layer comprises a first conductive line that electrically connects the connection pad and the bonding pad and a second conductive line that electrically connects the connection pad and the dummy bonding pad.

4. The semiconductor package of claim 1, further comprising a second connection member and a dummy connection member on a lower surface of the first substrate, wherein the second connection member is electrically connected to the substrate pad and the dummy connection member is electrically connected to the dummy substrate pad.

5. The semiconductor package of claim 4, wherein an electrical signal is at least one of inputted to and outputted from the second package through the second connection member.

6. The semiconductor package of claim 1, wherein the first package includes a plurality of semiconductor chips stacked on each other and the redistribution wiring layer is provided on the uppermost semiconductor chip.

7. The semiconductor package of claim 1, wherein the first package comprises a mold member that covers the first semiconductor chip and the mold member has an opening exposing the connection pad of the redistribution wiring layer.

8. The semiconductor package of claim 7, wherein the mold member covers the bonding pad of the redistribution wiring layer.

9. The semiconductor package of claim 7, wherein the first connection member is provided on a lower surface of a second substrate of the second package and is positioned in the opening to make contact with the connection pad.

10. A semiconductor package, comprising:
    a first package including a first substrate and a plurality of semiconductor chips stacked on each other on the first substrate;
    a redistribution wiring layer disposed above an uppermost semiconductor chip of the plurality of semiconductor chips and including a connection pad, a bonding pad electrically connected to the connection pad and a dummy bonding pad electrically connected to the bonding pad;
    a second package stacked on the first package, the second package including a second substrate, and a connection member formed on a lower surface of the second substrate, wherein the connection member contacts and is electrically connected to the connection pad;
    a bonding wire electrically connecting the bonding pad to a substrate pad on the first substrate; and
    a dummy bonding wire extending from the dummy bonding pad to a dummy substrate pad disposed on the upper surface of the first substrate, wherein the dummy bonding wire is connected to the dummy substrate pad and electrically connects the dummy bonding pad to the dummy substrate pad on the first substrate, and wherein the dummy bonding wire is electrically connected to the bonding wire through the dummy bonding pad and the bonding pad to provide a closed dummy circuit.

11. The semiconductor package of claim 10, wherein the redistribution wiring layer comprises a conductive line that electrically connects the bonding pad and the dummy bonding pad.

12. The semiconductor package of claim 10, wherein the redistribution wiring layer comprises a first conductive line that electrically connects the connection pad and the bonding pad and a second conductive line that electrically connects the connection pad and the dummy bonding pad.

13. The semiconductor package of claim 10, wherein the first package comprises a mold member that covers the first semiconductor chips and the mold member has an opening exposing the connection pad of the redistribution wiring layer.

14. The semiconductor package of claim 13, wherein the connection member is positioned in the opening.

15. The semiconductor package of claim 1, further comprising:
    a first outer connection pad disposed on a lower surface of the first substrate,
    a second connection member disposed on the first outer connection pad on the lower surface of the first substrate, wherein the substrate pad on the upper surface of the first substrate is electrically connected to the first outer connection pad by a first wiring of the first substrate;
    a second outer connection pad disposed on the lower surface of the first substrate,
    a dummy connection member disposed on the second outer connection pad on the lower surface of the first substrate, wherein the dummy substrate pad on the upper surface of the first substrate is electrically connected to the second outer connection pad by a second wiring of the first substrate.

16. The semiconductor package of claim 6, wherein the plurality of semiconductor chips include stepped portions and wherein a plurality of chips pads are disposed on the stepped portions of the semiconductor chips.

17. The semiconductor package of claim 10, further comprising:
    a first outer connection pad disposed on a lower surface of the first substrate,
    a second connection member disposed on the first outer connection pad on the lower surface of the first substrate, wherein the substrate pad on the upper surface of the first substrate is electrically connected to the first outer connection pad by a first wiring of the first substrate;
    a second outer connection pad disposed on the lower surface of the first substrate,
    a dummy connection member disposed on the second outer connection pad on the lower surface of the first substrate, wherein the dummy substrate pad on the upper surface of the first substrate is electrically connected to the second outer connection pad by a second wiring of the first substrate.

18. The semiconductor package of claim 10, wherein the plurality of semiconductor chips include stepped portions and wherein a plurality of chips pads are disposed on the stepped portions of the semiconductor chips.

* * * * *